United States Patent [19] [11] 4,056,423
Hughes [45] Nov. 1, 1977

[54] PLATEMAKING APPARATUS
[75] Inventor: Norman Edward Hughes, Landenberg, Pa.
[73] Assignee: Hercules Incorporated, Wilmington, Del.
[21] Appl. No.: 688,451
[22] Filed: May 20, 1976

Related U.S. Application Data

[63] Continuation-in-part of Ser. No. 571,030, April 23, 1975, abandoned.
[51] Int. Cl.$^2$ .......................... B05C 9/12; B05C 11/04
[52] U.S. Cl. ......................................... 156/356; 118/7; 118/413; 156/500; 156/575; 156/578; 156/582; 222/55; 222/163; 222/166; 355/85
[58] Field of Search .............. 156/356, 390, 500, 524, 156/526, 537, 547, 575, 577, 578, 582; 355/85, 97, 99, 100; 96/35.1; 222/55, 58, 163, 164, 166; 118/413, 421, 429

[56] References Cited

U.S. PATENT DOCUMENTS

| | | |
|---|---|---|
| 2,692,142 | 10/1954 | Hunter .................................. 222/164 |
| 2,753,099 | 7/1956 | Jenner et al. .......................... 222/55 |
| 3,351,237 | 11/1967 | Ortega ................................... 222/166 |
| 3,837,887 | 9/1974 | Akamatsu et al. ................. 96/35.1 X |
| 3,848,998 | 11/1974 | Yonekura et al. .................. 355/85 X |
| 3,971,691 | 7/1976 | Cairns .................................. 156/497 |

Primary Examiner—Charles E. Van Horn
Assistant Examiner—M. G. Wityshyn
Attorney, Agent, or Firm—James W. Peterson

[57] ABSTRACT

The invention is an improved liquid photopolymer applicator means for use on photorelief printing platemaking machines. The applicator means comprises a substantially vertical plate which acts as both the rear wall of the applicator means and as a doctor blade for uniformly spreading the photopolymer. The remaining sides of the applicator means form a scoop means which is substantially movably connected to the vertical plate to define a bottom slot-like opening immediately in front of the vertical plate to discharge the photopolymer at a controlled rate, said photopolymer being doctored by the vertical plate as the entire assembly traverses the length of the platemaking machine. The entire assembly is a part of a movable carriage which traverses the length of the platemaking machine, said carriage being movably mounted to said platemaking machine upon a shim which determines the thickness of the photopolymer plate desired, and said carriage driven by an adjustable gear means.

3 Claims, 2 Drawing Figures

PLATEMAKING APPARATUS

The application is a continuation-in-part of the application, Ser. No. 571,030, filed Apr. 23, 1975, now abandoned.

BACKGROUND OF THE INVENTION

In the past, processes and apparatus have been developed which apply a liquid photocurable polymer to a support surface, said apparatus providing means for leveling the applied composition to provide a substantially uniform thickness of composition over the support surface. U.S. Pat. No. 3,837,887 to Akamatsu, et al discloses apparatus which supplies a predetermined quantity of liquid resin in one load on the support surface and doctors said resin while simultaneously pressing a plastic backing sheet into the doctored surface of the polymer. Akamatsu, et al disclose apparatus which dumps in one load photopolymer on the support surface, the flow rate of said photopolymer varying depending upon the viscosity of the photopolymer and the depth of the photopolymer as it flows from the bucket. It can be seen that the flow rate of the photopolymer initially after rotation of the bucket will be greater than the flow rate at the point where the bucket has substantially traversed the length of the support surface. This pressure differential in the photopolymer becomes a critical difficulty when making thick plates or when traversing long distances, i.e., the thickness of the plate can vary from thick to thin as the assembly traverses the plate. The only other attempt at solving this problem is that shown in U.S. Pat. No. 3,751,164 to Miller, et al, which discloses a constant pressure dispensing manifold having nozzles to dispense at a uniform rate. The Miller, et al approach is far more complicated, expensive and difficult to maintain than the instant novel approach. The instant invention is an improvement over the Akamatsu, et al apparatus. The instant invention provides apparatus to prepare a smooth and precisely planer surface by metering the amount of photopolymer needed and doctoring the same independent of viscosities or depth of the photopolymer.

U.S. Pat. No. 3,848,998 Yonekura, et al discloses apparatus having a movable carriage to produce a plate of predetermined unvariable thickness. The instant invention provides apparatus which may vary the flow of photopolymer and which is adjustable in height to produce plates of varying thickness. Specifically, the instant invention is an improvment over Yonekura, et al in that the instant invention utilizes the combination of the variable flow rate applicator, a variable thickness shim on which the carriage moves, the preset thickness of said shim corresponding to the thickness of the printing plate desired and an adjustable gear means which drives said carriage.

OBJECTS OF THE INVENTION

It is a primary object of the instant invention to provide improved apparatus to regulate the flow of photopolymer liquid resin in any desired thickness for any desired length of travel onto a support surface.

It is another object of the instant invention to provide apparatus that is uncomplicated and inexpensive to build.

It is yet another object of the instant invention to provide apparatus that is easy to clean and maintain.

SUMMARY OF THE INVENTION

The purpose of the instant invention is to provide controllable photopolymer dispensing apparatus that can uniformly distribute liquid photopolymer of essentially any viscosity in any desired thickness or length. To accomplish this purpose, the instant invention provides photopolymer applicator means including a substantially vertical plate and a scoop that is substantially movably connected to said vertical plate, said scoop and said vertical plate defining therebetween a bottom opening slot to control liquid flow. The vertical plate provides doctoring means for said controlled flow as said scoop means and vertical plate traverse a flat horizontal support surface onto which the liquid photopolymer is to be uniformly distributed. The scoop and vertical plate are mounted to a carriage which traverses the flat horizontal support surface, the height of said carriage being determined by a shim member on said horizontal support surface, and said carriage being driven by a vertically adjustable gear means which includes a pinion member which engages a rack on said horizontal support surface.

DESCRIPTION OF THE PREFERRED EMBODIMENT

Figure 1:
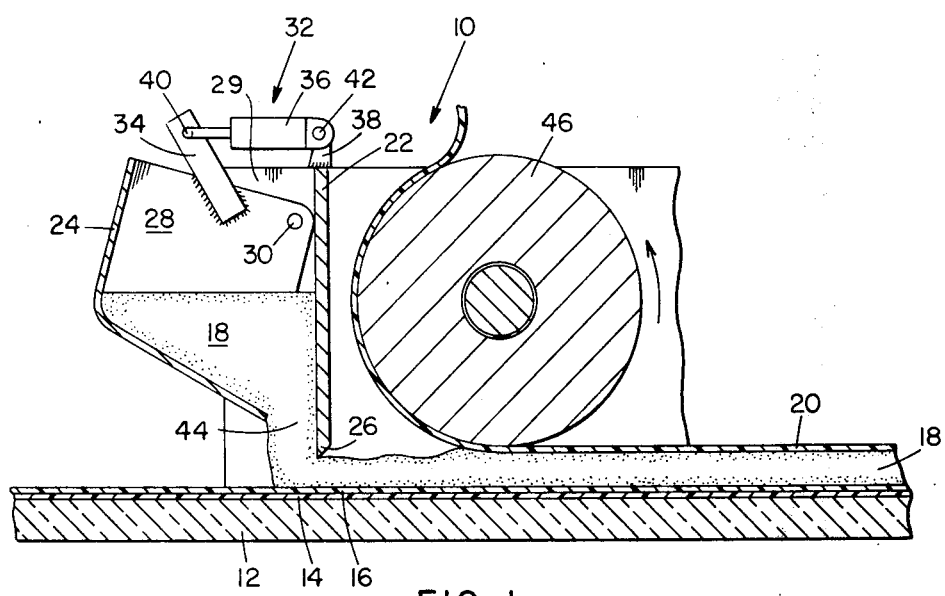
FIG. 1 is a cross-sectional view of the preferred applicator means and platemaking apparatus of the instant invention.

As can be seen in FIG. 1, platemaking apparatus 10 traverses horizontal flat plate 12 to the left to produce a photopolymer plate. Photo transparency 14 has been positioned on flat plate 12 and has been covered by cover film 16 to protect said transparency. Platemaking apparatus 10 traverses the photo transparency 14 and cover film 16 applying a photopolymer 18 onto the surface thereof and rolling backing sheet 20 into the photopolymer 18. The instant invention provides unique applicator means in the form of vertical plate 22 and scoop means 24. The lower portion of vertical plate 22 comprises a doctoring blade portion 26 to level the photopolymer 18. Scoop means 24 is shown to be open at the top and to have four walls, the thickness of the front and bottom walls being crosshatched in FIG. 1. The far end wall 28 of scoop means 24 is shown and the symmetrical near end wall is not illustrated. The outside end plate 29 (symmetrical end plate not shown) is rigidly connected to vertical plate 22 to contain photopolymer. Scoop means 24 is shown to be pivotally interconnected to end plate 29 and, therefore, to vertical plate 22 by pivot means 30. Scoop means 24 is rotated with respect to vertical plate 22 by rotation means generally noted at 32. Rotation means 32 comprises arm 34 rigidly connected to end wall 28 of scoop 24 and air cylinder 36 connected to vertical plate 22 by support means 38. Air cylinder 36 is pivotally connected to arm 34 at 40 and to support means 38 at 42. Thus, it can be seen that controlled actuation of air cylinder 36 will rotate scope means 24 in controlled fashion to regulate the opening 44 between scoop means 24 and vertical plate 22. Roller 46 is rotatably connected to the carriage of platemaking apparatus 10 to press the backing sheet 20 into the photopolymer 18 at a predetermined height. It is within the scope of the invention to provide other means than rotation means 32 to control the opening 44, such as electrical or hydraulic motors.

It is also within the scope of the invention to mount scoop means 24 for linear movement toward and away from vertical plate 22 to define a bottom opening 44 therebetween. It is also important to note that vertical plate 22 need not be perpendicular to flat plate 12 but may be inclined.

It can be appreciated that to produce printing plates of uniform thickness, the width of the opening 44 can be variably controlled while traversing flat plate 12 to provide a uniform flow of photopolymer 18 onto the surface of cover film 16. The width of the opening 44 may be increased while traversing flat plate 12 to compensate for photopolymer depth decrease and otherwise resulting flow rate decrease caused by decreasing head pressure.

In addition, precise control allows manufacture of both thick and thin plates as well as any thickness therebetween.

It is also important to note that the instant applicator means may be closed and reopened while the carriage traverses the flat surface. This is important when making a partial plate or more than one plate in line, i.e., photopolymer may be conserved.

Figure 2:
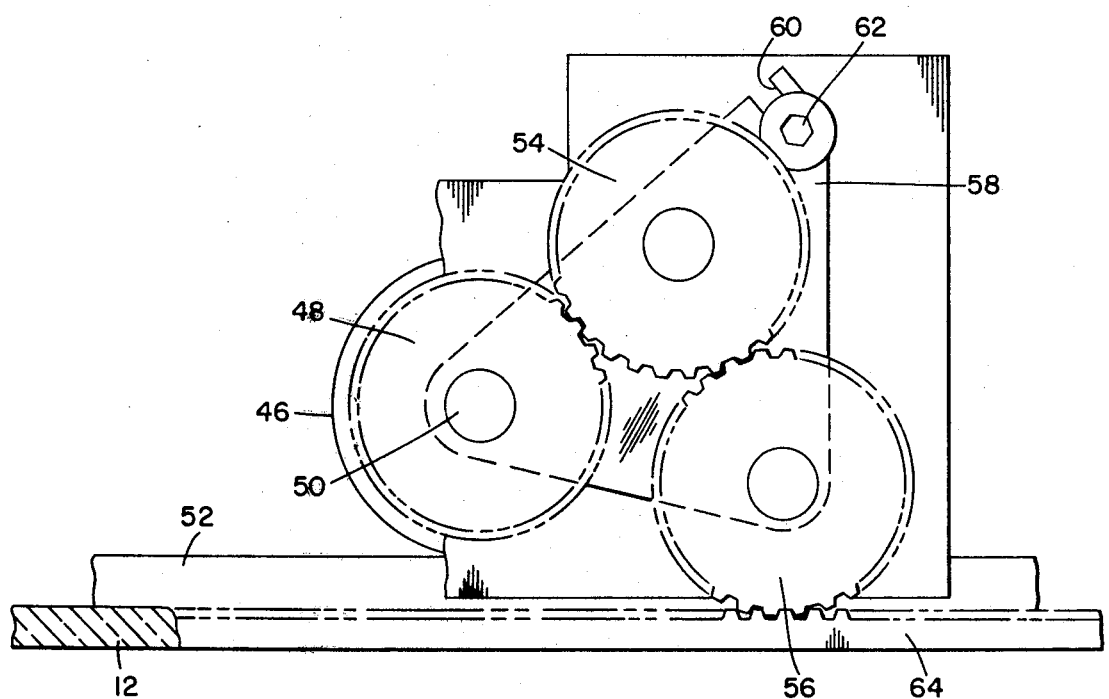
FIG. 2 is a partial cross-sectional end view of the preferred applicator means and platemaking apparatus shown in FIG. 1.

FIG. 2 illustrates a partial cross-sectional end view of the apparatus shown in FIG. 1. Roller 46 is driven by gear 48 which is interconnected to roller 46 by shaft 50. The height of roller 46 with respect to flat plate 12 is determined by shim 52 on which roller 46 rides. Shims of various thickness may be substituted for shim 52, depending upon the thickness of the photopolymer plate desired. Gear 48 is in turn driven by idler gear 54, which is in turn driven by driving pinion 56. Gear 48, idler gear 54 and driving pinion 56 are all rotatably mounted on vertically adjustable plate 58 which pivots about shaft 50. Plate 58 contains slot 60 through which attachment means in the form of the shank of a bolt 62 is inserted when bolt 62 is threaded into the body of the carriage. The height of the entire carriage assembly is determined by the height of roller 46, which is in turn determined by the thickness of shim 52. Once the thickness of shim 52 and thus the height of roller 46 is determined, plate 58 may be rotated to engage driving pinion 56 with rack 64 mounted to flat plate 12. Rack 64 is rigidly interconnected with flat plate 12. Drive means (not shown) rotates driving pinion 56 to move the carriage back and forth. A symmetrical driving pinion, idler gear, gear, rack and plate (all not shown) may be mounted on the other end of the carriage. Driving pinion 56 and rack 64 along with the symmetrical components (not shown) insure uniform movement of the platemaking apparatus 10 (shown in FIG. 1) as it traverses the horizontal flat plate 12 to produce a photopolymer plate. The driving pinion, idler gear, gear and rack and their symmetrical counterparts, if desired, comprise the vertically adjustable gear means that drives the carriage.

While preferred embodiments of the invention have been illustrated and described, it will be appreciated that variations therefrom may be made without departing from the scope of the invention.

What I claim and desire to protect by Letters Patent is:

1. In combination with photopolymer platemaking apparatus wherein a horizontal flat plate, a photo transparency on said flat plate, a cover film on said photo transparency, and a movable carriage to traverse said flat plate, said carriage having photopolymer supply means, a press roll and backing sheet supply means all mounted on said carriage, are provided for making a photorelief printing plate, wherein the improvement comprises:

a substantially vertical plate connected to said carriage, said vertical plate acting as a back wall and as a doctor blade;

scoop means abutting said vertical plate and being movable with respect to said vertical plate, movement of said scoop means with respect to said vertical plate defining a bottom opening between said scoop means and said vertical plate to control the flow of photopolymer therethrough;

actuator means interconnecting said scoop means and said vertical plate to control the speed and amount of movement of said scoop means with respect to the vertical plate and the resulting opening between said scoop means and said vertical plate, whereby said opening provides uniform flow of a photopolymer onto the surface of the cover film and said vertical plate doctors said photopolymer to uniform thickness before the application of a backing sheet onto the surface thereof;

a shim means connected to said flat plate, said press roll riding on said shim, the height of said press roll from said flat plate being determined by the thickness of said shim means; and gear means connected to said press roll and said flat plate, said gear means pivotally mounted to said carriage and being thereby vertically adjustable to compensate for the height of said press roll from said flat plate, said gear means driving said carriage.

2. A device as in claim 1 wherein said gear means comprises:

a gear concentrically connected to said press roll;
an idler gear contacting said gear;
a driving pinion contacting said idler gear;
a plate pivotally mounted to said carriage, said gear, idler gear and driving pinion rotatably mounted on said plate, said plate having a slot contained therein and having attachment means extending therethrough to said carriage to secure said plate to said carriage at a desired angle of rotation; and rack means connected to said flat plate, said driving pinion contacting said rack means to guide said driving pinion along the length of said rack means when said carriage traverses said flat plate, said rack means and driving pinion rotating said press roll on top of said shim means through said idler gear and gear means.

3. A device as in claim 2 wherein said scoop means is rotatable with respect to said vertical plate, rotation of said scoop means with respect to said vertical plate defining a bottom opening between said scoop means and said vertical plate.

* * * * *